United States Patent [19]
Buck et al.

[11] Patent Number: 5,489,854
[45] Date of Patent: Feb. 6, 1996

[54] IC CHIP TEST SOCKET WITH DOUBLE-ENDED SPRING BIASED CONTACTS

[75] Inventors: Roy V. Buck, Oak Ridge; David N. Tesh, Randleman, both of N.C.

[73] Assignee: Analog Devices, Inc., Norwood, Mass.

[21] Appl. No.: 41,496

[22] Filed: Apr. 1, 1993

[51] Int. Cl.[6] .................................................. G01R 15/12
[52] U.S. Cl. .......................... 324/761; 324/754; 324/755
[58] Field of Search ........................... 324/158 R, 158 F, 324/158 P, 72.5, 761, 754, 537, 158.1, 755; 437/8; 439/482; 361/748

[56] References Cited

U.S. PATENT DOCUMENTS

| | | | |
|---|---|---|---|
| 4,528,500 | 7/1985 | Lightbody et al. | 324/537 |
| 4,560,926 | 12/1985 | Cornu et al. | 324/72.5 |
| 4,700,132 | 10/1987 | Yarbrough et al. | 324/158 F |
| 4,884,024 | 11/1989 | DiPerna | 324/761 |
| 4,962,356 | 10/1990 | Eberlein et al. | 324/158 F |
| 5,055,777 | 10/1991 | Bonelli et al. | 324/158 F |
| 5,086,269 | 2/1992 | Nobi | 324/158 F |
| 5,227,718 | 7/1993 | Stowers et al. | 324/761 |
| 5,245,277 | 9/1993 | Nguyen | 324/158 F |
| 5,257,165 | 10/1993 | Chiang | 361/748 |

FOREIGN PATENT DOCUMENTS

| | | | |
|---|---|---|---|
| 2113483 | 8/1983 | United Kingdom | 324/158 P |
| 2245111 | 12/1991 | United Kingdom | 324/158 P |

OTHER PUBLICATIONS

*VLSI Technology,* 2d Ed., McGraw–Hill Book Company, 1988, pp. 569–570 (month is not available).
CIN.APSE A New Patented Technology Bringing PC Interconnects Up To Speed, by Labinal Components and Systems, Inc., 1989 (month is unavailable).
Silver Stax Elastomeric Connectors by Elastomeric Technologies, Inc., Feb. 1989.
Interconnect Devices, Inc. Catalog, 1991, pp. 26, 27 and 38 (month is unavailable).

*Primary Examiner*—Vinh P. Nguyen
*Attorney, Agent, or Firm*—Koppel & Jacobs

[57] ABSTRACT

A test socket for a surface mount IC chip includes an array of double-ended spring contacts that extend out from opposite sides of a substrate, with a positioning frame on top of the substrate for aligning a chip and its leads with the upper contact heads. The spring contacts preferably have hollow elongate bodies with contact heads extending out from opposite sides under an internal spring bias. The socket can be formed from two laminates which have a series of aligned openings for the spring contacts, with expanded midsections on the spring contacts press-fit into the laminate openings and thereby securing holding the laminates together. A standoff on the upper socket surface vertically positions the IC chip, and provides the proper contact pressure between its leads and the spring contacts. The test socket can be removably mounted to a PC test board, with a releasable clamping device such as an air cylinder used to hold a chip to be tested in place within the socket.

16 Claims, 4 Drawing Sheets

IC CHIP TEST SOCKET WITH DOUBLE-ENDED SPRING BIASED CONTACTS

BACKGROUND OF THE INVENTION

1. Field of the Invention

This invention relates to devices for establishing electrical contact to an integrated circuit (IC) chip, and more particularly to a test socket for high speed surface mount IC chips whose testing is sensitive to added capacitances and inductances.

2. Description of the Related Art

Surface mounting, in which the leads of an IC chip are soldered directly to a circuit board, has become a popular packaging technique. Various lead configurations have been developed, such as J-type, gull-winged, butt-leaded and leadless packages, in which leads or contact pads on the chip are soldered directly to the circuit board. Surface mount packaging is discussed in general and illustrated in Sze, ed., *VLSI Technology*, 2d Ed., McGraw-Hill Book Company, 1988, pages 569–570.

A number of different test sockets have been developed that allow surface mount chips to be temporarily connected to a test board without being soldered in place, and then removed from the socket when the testing has been completed. The ideal test socket would be inexpensive, have a long life time, not add significant amounts of capacitance or inductance that can introduce errors when testing high speed chips, and be adaptable to different chip configurations. While numerous test sockets are available that provide an electrical interface between a chip to be tested and a test board, none of them satisfy all of the above requirements.

One test socket, produced by the Cinch division of Labinal Components and Systems, Inc. under the trademark CIN.APSE, uses gold plated wire that is rolled into springy masses and captured in buttons to provide electrical connections between the leads of a device under test (DUT) and contact pads on a test board. Pressing the chip down against the array of buttons establishes electrical contacts between the chip pins and the test board pads on opposite sides of the buttons. This type of device is described in the brochure "CIN.APSE A New Patented Technology Bringing PC Interconnects Up To Speed" by Labinal Components and Systems, Inc., 1989. While the test socket is capable of establishing firm electrical connections between the chip and the test board, it is quite expensive and has a short life time, on the order of 20,000 chip insertions, which typically represents approximately three weeks of use.

Another structure that has been used for testing surface mount chips is an elastomeric connector produced under the trademark SILVER STAX by PCK Elastomerics, Inc. The connectors consist of conductive silver impregnated layers of silicone that are separated by nonconductive silicone layers. The dimensions of the lamination can be selected so that successive conductive layers align with successive leads of a DUT, with a separate clamp used to hold the DUT in place. The connectors are described in a technical data sheet entitled "SILVER STAX Elastomeric Connectors" by Elastomeric Technologies, Inc., February 1989. When used for surface mount chip testing, the connectors are normally inserted into slots within a test socket housing. In volume testing applications the elastomeric connectors generally have an even shorter life time than the CIN.APSE test socket, typically not more than one week. Furthermore, they are subject to a buildup of oxide on the silvered conductors, which can lead to intermittent contacts.

SUMMARY OF THE INVENTION

The present invention seeks to provide a test socket for surface mount IC chips that satisfies all of the requirements stated above for an ideal test socket. This is accomplished by providing an array of double-ended spring contacts in a substrate, in alignment with the leads (or contact pads) of a surface mount chip. Spring-biased contact heads extend out from the contacts on opposite sides of the substrate. With the socket attached to a test board with the lower contact heads contacting respective pads on the board and the DUT leads held over the upper contact heads, the spring contacts establish electrical connections between a DUT and the board. A frame is provided on the substrate to hold the DUT in place, with its leads aligned with respective contact heads.

In the preferred embodiment, the spring contacts have hollow elongate bodies, with the contact heads extending out from opposite sides of the bodies and springs held within the bodies to bias the contact heads outward. A standoff on the upper side of the substrate elevates the DUT above the substrate surface, preventing the DUT leads from bottoming out against the spring contact bodies.

The bodies of the spring contacts have expanded midsections that are used to hold them in place within the socket substrate. In one embodiment, the substrate consists of a pair of laminations that have mutually aligned openings for the spring contacts. Opposite ends of the spring contacts are inserted into respective openings in each lamination and the laminations are brought together under force, causing the expanded midsections to be press-fit into the openings of both laminations. This locks the contacts firmly in place, and also holds the laminations together without the need for any adhesive. The spring contact bodies are formed from a stiffly deformable material, with their midsections sized slightly larger than the lamination openings so that they are deformed somewhat when the laminations are pressed together. Alternately, the contact springs can be molded into the substrate.

The test socket can be mounted to a test board by an easily removable mechanical connector, such as simple bolts. The chip is held in place within the socket and pressed down against the contact springs by means of a releasable clamping mechanism that extends up from the board; the clamp preferably includes an air cylinder for this purpose.

Further features and advantages of the invention will be apparent to those skilled in the art from the following detailed description, taken together with the accompanying drawings.

DETAILED DESCRIPTION OF THE INVENTION

Figure 1:
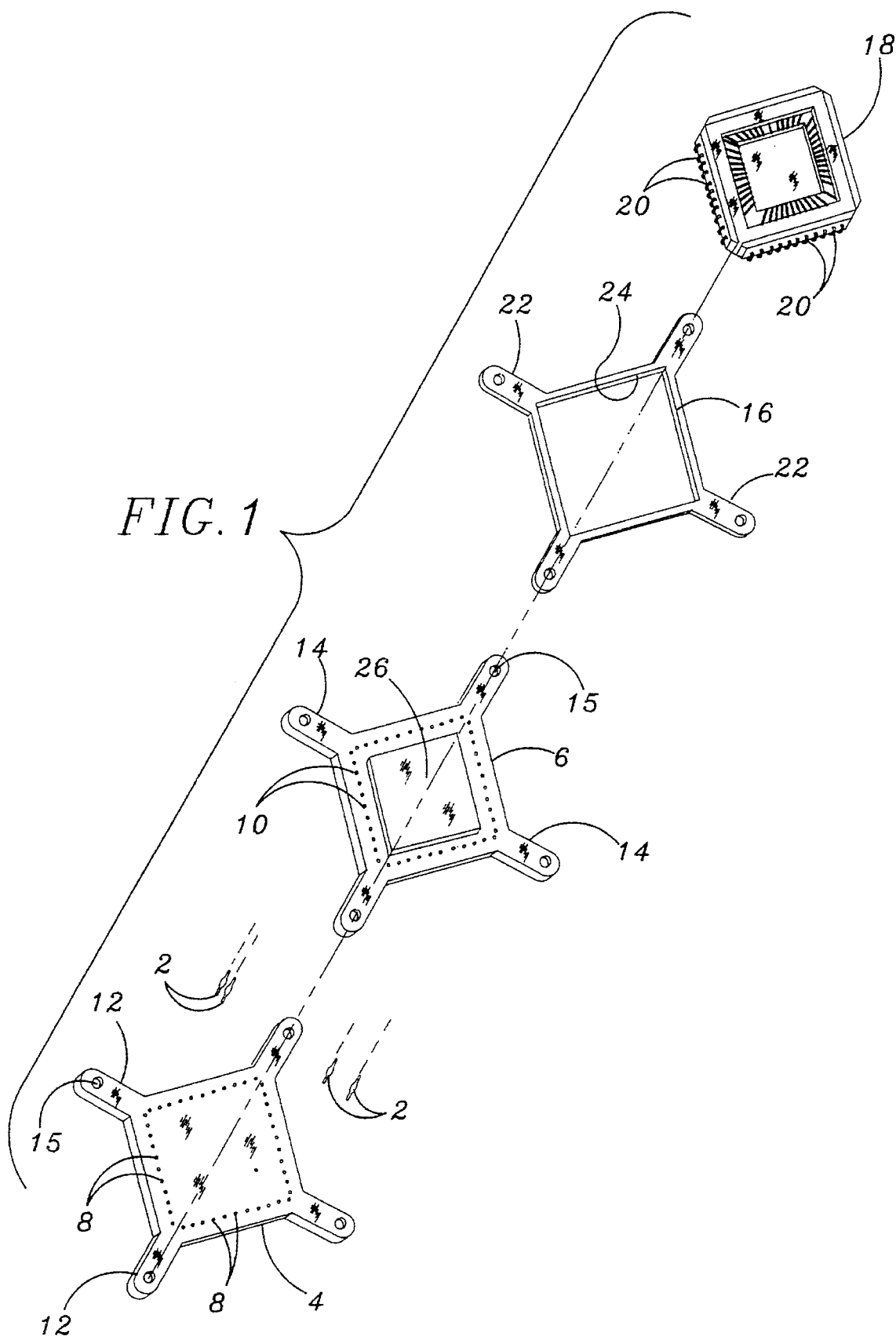
FIG. 1 is an exploded perspective view of a test socket for a surface mount IC chip in accordance with the invention.

FIG. 1 shows one embodiment of the invention that is particular useful when only a relatively small number of test sockets are required. This embodiment is constructed by assembling a series of laminations to form the overall socket. Alternately, if a large number of sockets is desired for purposes of commercial sale rather than just internal use, the provision of a mold to form the socket as a unitary molded piece may be justified. In either case, the same electrical contact mechanism is employed to electrically communicate between an IC chip held in the socket, and an underlying circuit board.

The socket is intended particularly for the testing of high speed devices that are sensitive to the length of the conductor runs which interconnect the DUT and the test circuit board. The contacts between the DUT and the runs on the test board are made using miniature double-ended spring contacts 2. For simplification, only one of these contacts is shown in FIG. 1, but in practice a separate contact would be provided for each lead of the surface mount DUT. Similar but larger spring contacts are currently available from Transco Corp.

In the embodiment of FIG. 1, the spring contacts are held in place within two substrates or laminations 4 and 6, with opposite ends of the contact mechanism extending out from opposite sides of the substrates after they are assembled. The spring contacts are secured within corresponding aligned openings 8 and 10 in the lower and upper substrates 4 and 6, respectively. The substrates include a mechanism for removably attaching them to a test board, such as arms 12 and 14 which extend out from the corners of the substrates; openings 15 are provided in the arms through which bolts may be inserted to hold the substrates to the test board. The substrates are formed from a dielectric material such as epoxy glass. A particular material that is suitable for the substrates is Polypenco® PEEK (polyetheretherketone) by Imperial Chemical Industries, Inc.

A frame 16 that holds an IC chip 18 in place, with the chip leads 20 aligned with the upper ends of respective spring contacts 2, is adhered to the upper surface of the upper substrate 6, preferably with a quick drying epoxy glue. The frame 16 has the same general shape as the substrates 4 and 6, with arms 22 extending out from its corners in alignment with the substrate arms 12 and 14. In this manner the bolts that are used to hold the substrates to the test board also extend through aligned openings in the frame arms 22.

The frame has a central opening 24 that is slightly larger than the outer dimensions of the IC chip 18, allowing the chip to be easily inserted into and removed from the opening, while securely holding the chip in position with its leads aligned with and contacting respective spring contacts. The frame 16 can be formed from the same type of material as the substrates 4 and 6. A centrally located standoff 26 extends up from the upper surface of the upper substrate 6 to prevent the leads of the DUT from bottoming out on the bodies of the spring contacts. The standoff can be formed from the same material as the substrates or from any other convenient dielectric material, such as a ceramic, and is preferably secured to the substrate surface with a quick setting epoxy.

Figure 2:
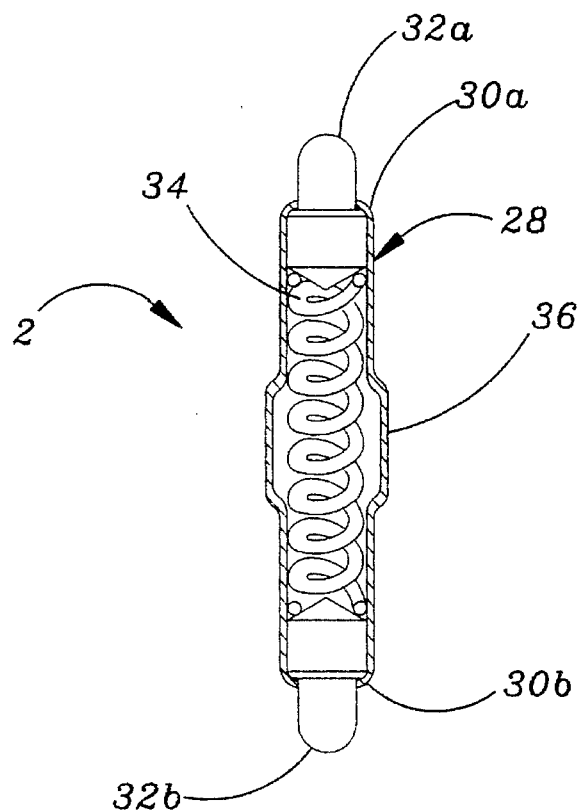
FIG. 2 is a partially sectioned view of a spring contact used in the test socket.

An enlarged view of one of the preferred spring contacts is given in FIG. 2. It includes a generally barrel-shaped hollow elongate body 28 that is formed from a stiffly deformable material such as a gold plated nickel/silver alloy, about 2–3 mils thick. The body 28 includes crimps 30a, 30b which surround openings at its opposite ends, through which openings the forward ends of contact heads 32a and 32b respectively extend. The rear sections of the contact heads have enlarged diameters, and are retained within the body 28 by the crimps. The contact heads are formed from a hard conductive material, such as hardened BeCu, gold plated over nickel. A coil spring 34, preferably fabricated from gold plated music wire or stainless steel, is held in compression within the body 28 between the opposite contact heads 32a and 32b. In the preferred embodiment the coil spring gives each contact head a 0.9 oz. preload spring force; the spring force is preferably 2.4 oz. when one of the contact heads has been pushed in 0.027 inches, and 3.1 oz. for a 0.040 inch contact head excursion. The spring provides an electrical connection between the opposed contact heads, preferably with a contact resistance of about 35 mohms at 25 mA, and a continuous current rating of 3A. As shown in FIG. 2, the contact heads 32a and 32b are normally biased by spring 34 to maximum outward positions against their respective crimps 30a and 30b. Since the crimps prevent any further outward movement of the contact heads, the contact heads are moveable only inward into the spring contact bodies 28 against the preloaded force of the spring 34.

In the preferred embodiment described herein, the length of the body is about 0.14 inches, while the overall length of the spring contact 2 between the extended tips of the contact heads is about 0.18 inch. The outside diameter of the body 28 is about 0.027 inches except for its midsection 36, which has an enlarged outer diameter of about 0.030 inches. As described below, this enlarged midsection is used to both secure the contact springs within the laminations 4 and 6, and to hold the laminations together without the need for an adhesive.

Figure 3:
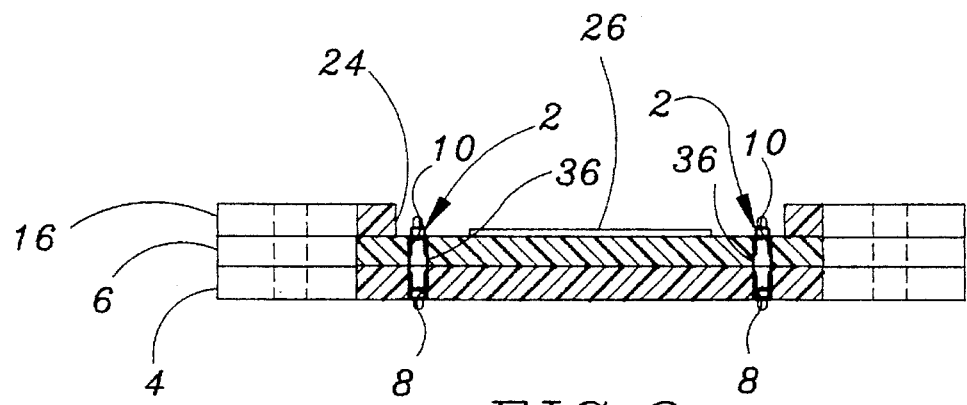
FIG. 3 is a sectional view of the test socket.

A sectional view of the test socket is shown in FIG. 3. The spring contacts 2 are lodged within respective aligned openings 8 and 10 in the substrates 4 and 6, respectively. The two substrates are flush with each other along major surfaces, with the expanded midsections 36 of the contact springs extending into the openings of both substrates on opposite sides of their interface. The lower ends of the spring contact bodies are preferably flush with the bottom surface of the lower substrate 4, while the upper ends of the spring contact bodies extend slightly above the top surface of the upper substrate 6. Thus, since as stated above the contact heads 32a and 32b of each spring contact 2 are normally spring biased to maximum outward positions against their respective crimps 30a and 30b, the contact heads 32a and 32b are normally also spring biased to maximum outward positions relative to the collective substrate 4/6, as shown in FIG. 3, and are moveable only inward into the substrate against the force of their respective coil springs 34. The frame 16 surrounds the spring contacts 2, with a clearance between the frame opening 24 and the spring contact bodies of about 0.03 inches in the illustrated embodiment.

As shown, the lower substrate 4 has a thickness of about 0.062 inches, while the thickness of the upper substrate 6 can range from about 0.03–0.08 inches, depending upon the desired extension of the spring contact heads above the upper substrate surface. For optimum contact with the pads of a circuit board below the test socket and the leads of a DUT positioned in the socket, the spring contact heads should deflect a minimum of about 0.01 inches into their respective bodies.

The substrate openings 8 and 10 are slightly smaller in diameter than the outer diameter of the enlarged spring contact midsections 36. The two substrates are press-fit together from opposite sides of the contact springs, slightly deforming the midsections 36 within openings 8 and 10 in the process. This establishes a secure gripping between the spring contact bodies and both substrates, which fastens the spring bodies within the substrates and also holds the two substrates tightly together.

Figure 4A:
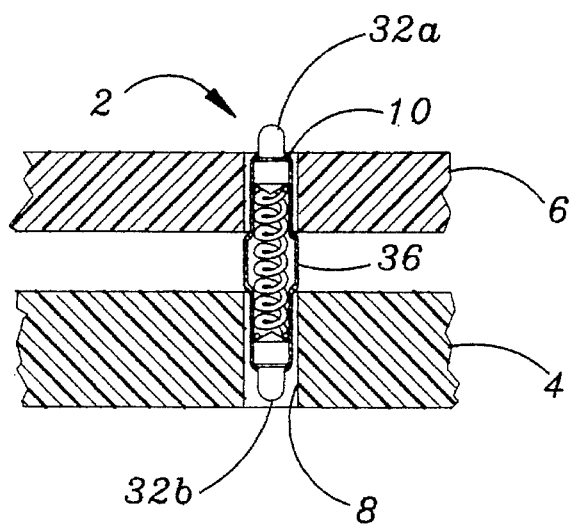
FIGS. 4a and 4b are fragmentary sectional views illustrating successive steps in the fabrication of one embodiment of the test socket.
Figure 4B:
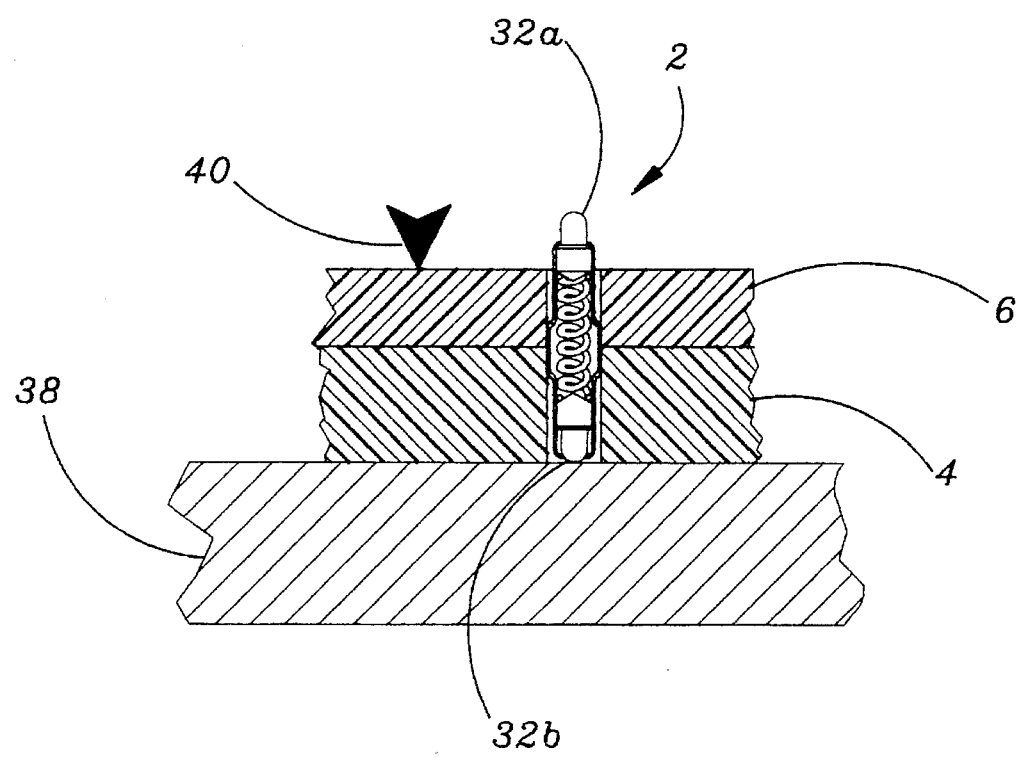

A preferred method for assembling the substrates with the spring contacts is illustrated in FIGS. 4a and 4b. Only one contact spring is shown for purposes of simplification, but the same assembly procedure would be performed simultaneously with all of the contact springs in place. The lower ends of the contact springs are initially loaded into the openings 8 in the lower substrate 4; this can be done manually with the use of tweezers. The upper substrate 6 is then positioned over the upper ends of the contact springs and pressed down (using finger pressure) until the contact springs are seated within the openings in the upper and lower substrates up to the enlarged midsections 36. Next, as illustrated in FIG. 4b, the lower substrate 4 is placed upon a flat metal plate 38, forcing the lower contact heads 32b into the contact spring bodies. A downward force 40 is then applied to the center of the upper substrate 6 to force the two substrates 4 and 6 together. This force can be applied by placing the assembly in an arbor, with the arbor lowered against a pressure plate that is temporarily positioned over the center of the upper substrate 6, inward from the contact springs. The downward pressure forces the enlarged spring midsections 36 into the openings 8 in the lower substrate, until the lower ends of the contact spring bodies bottom out on the plate 38 flush with the lower surface of substrate 4. It also forces the upper substrate 6 down around the enlarged spring midsections. Care should be taken that the openings 8 in the lower substrate are no smaller than the openings 10 in the upper substrate, to prevent the spring midsections 36 from being press fit only into the upper substrate.

Figure 5:
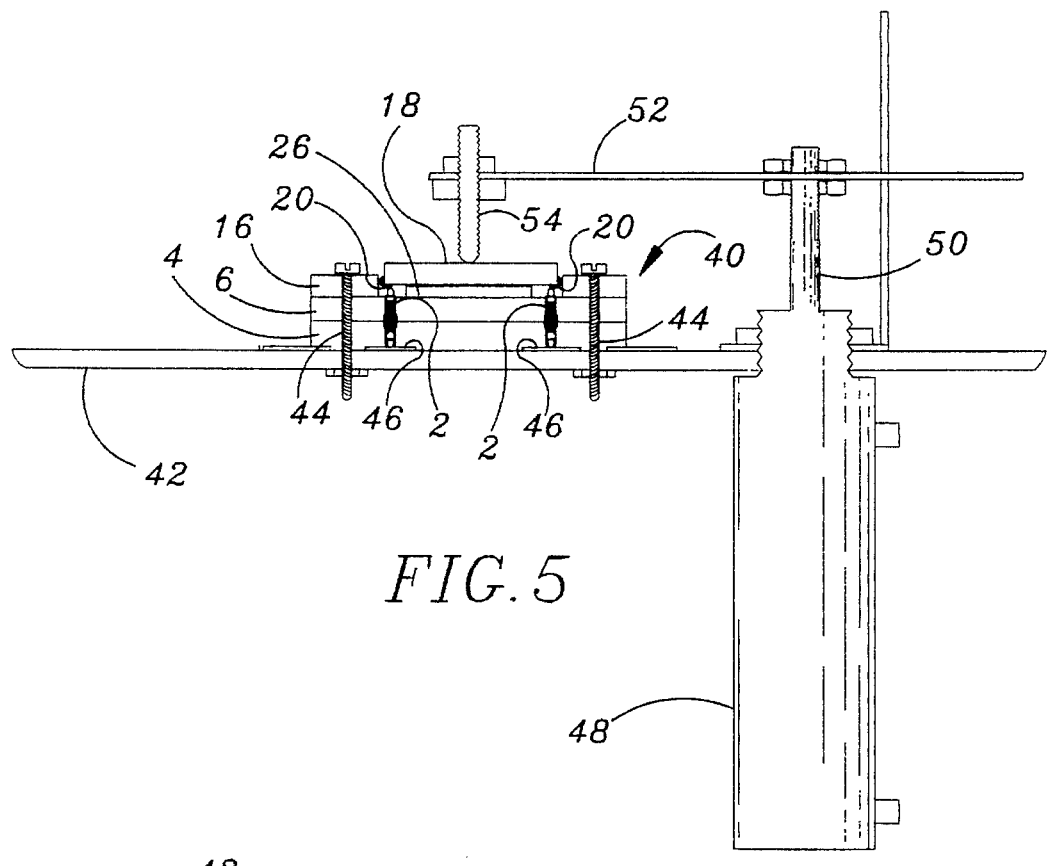
FIGS. 5 and 6 are respectively front elevation and top plan views of an overall test structure that incorporates the test socket of the invention.
Figure 6:
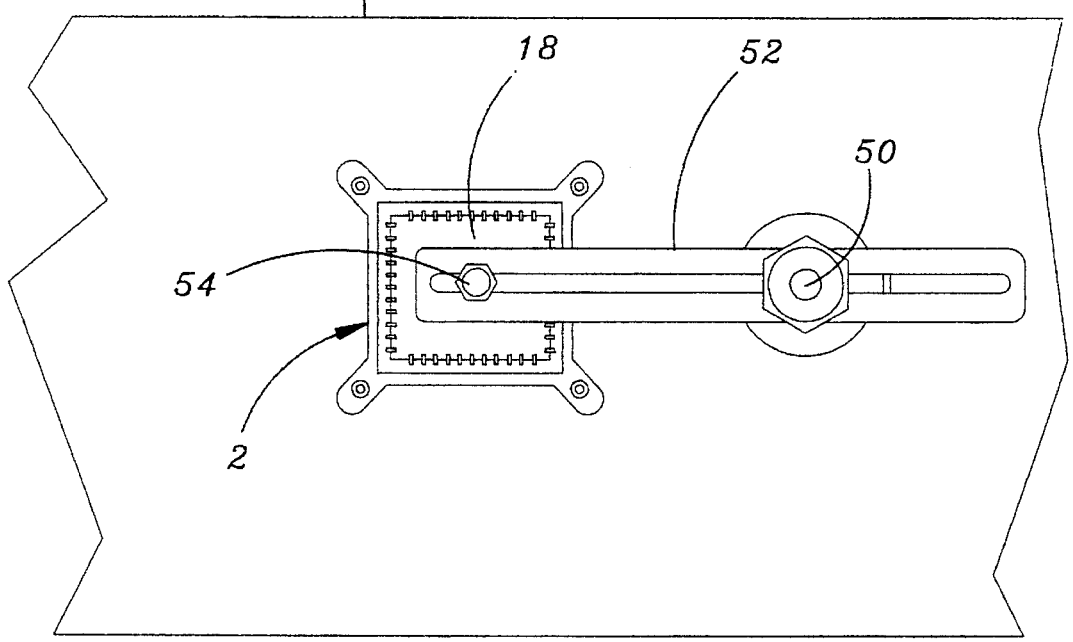

A structure for utilizing the socket to test a surface mount IC chip is shown in FIGS. 5 and 6. The assembled socket 40 is fastened to a test PC-board 42 with bolts 44 that extend through the aligned openings 15 in the socket arms 12, 14 and 22 and corresponding openings in the board. The socket is aligned so that the lower spring contact heads bear against and establish electrical contact with corresponding contact pads 46 on the board. These contact pads are interconnected by metallization traces on the upper and/or lower board surface to terminals for applying input signals to, and receiving output signals from, the DUT.

The DUT 18 itself is positioned within the frame 16, with its leads 20 contacting and depressing respective upper spring contact heads. The lower surface of the DUT is supported by the standoff 26, the thickness of which is selected so that the leads 20 depress the spring contact heads by a desired amount without bottoming against the spring contact bodies. A clearance is left between the standoff and the DUT leads to prevent the standoff from interfering with the electrical contacts.

The DUT is held in place within the test socket by a pressure device, which can be a manual press but is preferably implemented with an air cylinder 48. The PC board and air cylinder are clamped together, with a piston 50 that is moved vertically by the air cylinder extending upward above the board and test socket. A beam 52 is attached to the upper end of the piston and extends transversely over the test socket. A positionable, downward extending pressure pin 54 is clamped to the beam 52 and centered over the DUT 18. The air cylinder is operated to lift the pressure pin when it is desired to position an IC chip within the test socket or remove a chip that has already been tested from the socket, and to lower the pin against a DUT that has been placed in the socket for testing. The exact amount of holding pressure imparted by the air cylinder is not critical, so long as it is strong enough to securely hold the DUT in place without damaging any of the parts; the thickness of the standoff 26 establishes the amount of contact pressure between the DUT leads 20 and the heads of the spring contacts.

The test socket establishes very short and direct contacts between the DUT and the test board, thus minimizing any capacitance and inductance introduced into the testing procedure by the socket. The socket's spring contacts do not damage the fragile leads of the surface mount chips, and thus do not degrade high chip yields. The spring contacts have a long service life, on the order of 250,000 DUT insertions, and provide a superior compliance to non-planar leads. The socket does not have to be soldered into the test board, and can thus be quickly changed with no damage done to the board from desoldering. Its ease and simplicity of manufacture also significantly reduce the amount of lead time required to fabricate a custom socket.

While a particular embodiment of the invention has been shown and described, numerous variations and alternate embodiments will occur to those skilled in the art. For example, although the test socket has been described herein in connection with a packaged surface mount chip, it can also be used for testing and burn-in of the unpackaged IC, and also for dynamic testing at the wafer probe stage. Accordingly, it is intended that the invention be limited only in terms of the appended claims.

I claim:

1. A test socket for a multi-contact integrated circuit (IC) chip, comprising:

a substrate with an array of openings, an array of double-ended spring contacts having expanded midsections that are press-fit into respective openings of said substrate so as to be positively retained in said substrate, each spring contact having a pair of contact heads, and a spring biasing said contact heads to extend out from opposite respective sides of the substrate, said springs being held in compression between their respective contact heads and electrically connecting said contact heads, with said contact heads normally spring biased to maximum outward positions relative to said substrate and being moveable only inward into said substrate against the force of their respective springs, and a positioning structure on one side of said substrate for holding an IC chip with the chip's contacts aligned with the contact heads of respective spring contacts on that side of the substrate, said positioning structure holding the IC chip relative to said substrate so that said contact heads are contacted and depressed by respective IC chip contacts when the IC chip is moved towards said substrate, said substrate comprising a pair of substrate laminations that have mutually aligned arrays of openings, with each spring contact lodged in a respective pair of aligned openings in each lamination with its expanded midsection press-fit into both lamination openings to secure said laminations together immediately adjacent each other without adhesive.

2. The test socket of claim 1, said substrate comprising a dielectric and said spring contacts being formed from conductive material.

3. A test socket for a multi-contact integrated circuit (IC) chip, comprising:

a substrate, an array of double-ended spring contacts positively retained in said substrate, each spring contact comprising a hollow elongate body with an expanded midsection and a pair of contact heads extending out from opposite sides of the body, and a spring within said body biasing said contact heads to extend out from opposite respective sides of the substrate, said springs being held in compression between their respective contact heads and electrically connecting said contact heads, with said contact heads normally spring biased to maximum outward positions relative to said substrate and being moveable only inward into said substrate against the force of their respective springs, and a positioning structure on one side of said substrate for holding an IC chip with the chip's contacts aligned with the contact heads of respective spring contacts on that side of the substrate, said substrate including a plurality of openings, said spring contacts being lodged within respective ones of said openings with their expanded midsections press-fit in their respective openings to positively retain the spring contacts in place, said substrate comprising a pair of substrate laminations that have mutually aligned arrays of openings, with each spring contact lodged in a respective pair of aligned openings in each lamination with its expanded midsection press-fit into both lamination openings to secure said laminations together immediately adjacent each other without adhesive.

4. The test socket of claim 1, said chip positioning structure comprising a frame for said chip.

5. A test socket for a multi-contact integrated circuit (IC) chip, comprising:

a substrate with an array of openings, a standoff on said substrate for elevating an IC chip above the substrate surface, an array of double-ended spring contacts having expanded midsections that are press-fit into respective openings of said substrate so as to be positively retained in said substrate, each spring contact having a pair of contact heads, and a spring biasing said contact heads to extend out from opposite respective sides of the substrate, said springs being held in compression between their respective contact heads and electrically connecting said contact heads, with said contact heads normally spring biased to maximum outward positions relative to said substrate and being moveable only inward into said substrate against the force of their respective springs, and a positioning structure on one side of said substrate for holding an IC chip with the chip's contacts aligned with the contact heads of respective spring contacts on that side of the substrate, said substrate comprising a pair of substrate laminations that have mutually aligned arrays of openings, with each spring contact lodged in a respective pair of aligned openings in each lamination with its expanded midsection press-fit into both lamination openings to secure said laminations together immediately adjacent each other without adhesive.

6. The test socket of claim 5, said spring contacts comprising hollow elongate bodies with said contact heads extending out from opposite sides of said bodies, and springs within said bodies biasing said contact heads outwards, wherein said spring contact bodies extend above the substrate surface on the chip side of the substrate, and said standoff prevents the chip contacts from bottoming out against said spring contact bodies.

7. A multi-contact electrical interconnection structure for interconnecting a pair of devices that have an array of mutually aligned and opposed electrical contacts, comprising:

first and second substrates having respective arrays of mutually aligned openings extending between opposed major surfaces of the substrates, said substrates positioned immediately adjacent to each other along major surfaces, and an array of double-ended spring contacts retained in said substrate openings, said spring contacts each having a pair of spring biased contact heads that are electrically connected to each other and spring biased to extend out from opposite respective sides of said substrates, and respective hollow bodies from which said contact heads extend, said bodies each having a single continuous expanded midsection that is press-fit into a respective pair of aligned openings in said substrates to positively retain the spring contacts in place and secure the substrates together immediately adjacent each other without adhesive.

8. The electrical interconnection structure of claim 7, wherein said spring contact bodies are formed from a stiffly deformable material that is deformed by said substrate openings to positively retain the spring contacts in place.

9. A test structure for a multi-contact integrated circuit (IC) chip, comprising:

a) a circuit board having an array of contacts arranged in alignment with at least some of the contacts of said IC chip, b) a test socket for said IC chip, comprising:

i) a substrate having an array of openings, ii) an array of double-ended spring contacts having expanded midsections that are press-fit into respective openings of said substrate so as to be positively retained in said substrate, each spring contact having a pair of electrically connected contact heads that are spring biased to extend out from opposite respective sides of the substrate, and iii) a positioning structure on one side of said substrate for holding an IC chip with the chip's contacts aligned with the contact heads of respective spring contacts on that side of the substrate, said positioning structure holding the IC chip relative to said substrate so that said contact heads are contacted and depressed by respective IC chip contacts when the IC chip is moved towards said substrate, said substrate comprising a pair of substrate laminations that have mutually aligned arrays of openings, with each spring contact lodged in a respective pair of aligned openings in each lamination with its expanded midsection press-fit into both lamination openings to secure said laminations together immediately adjacent each other without adhesive, c) means for mounting said test socket on said circuit board with the spring contact heads that are located on the opposite side of the substrate from the chip positioning structure contacting respective board contacts and being depressed by said circuit board contacts inward into said substrate against said spring bias, d) means for releasably clamping an IC chip in said positioning structure so that the chip's contacts bear against respective spring contact heads and depress said contact heads inward into said substrate against said spring bias with said contact springs electrically interconnecting the circuit board contacts with respective chip contacts, and e) an electrical interconnection network on said circuit board for applying test signals to and receiving response signals from said chip through said spring contacts.

10. The test structure of claim 9, said chip positioning structure comprising a frame for said chip.

11. The test structure of claim 10, wherein said releasable clamping means bears against the outer surface of said IC chip to urge the chip into its frame.

12. The test structure of claim 9, wherein each of said spring contacts includes a spring biasing the contact's contact heads to extend out from opposite sides of said substrate, said springs being held in compression between their respective contact heads and electrically connecting said contact heads, with said contact heads normally spring biased to maximum outward positions relative to said substrate and being moveable only inward into said substrate against the force of their respective springs.

13. A test structure for a multi-contact integrated circuit (IC) chip, comprising:

a) a circuit board having an array of contacts arranged in alignment with at least some of the contacts of said IC chip, b) a test socket for said IC chip, comprising:
   i) a substrate with an array of openings,
   ii) an array of double-ended spring contacts having expanded midsections that are press-fit into respective openings of said substrate so as to be positively retained in said substrate, each spring contact having a pair of electrically connected contact heads that are spring biased to extend out from opposite respective sides of the substrate, said substrate comprising a pair of substrate laminations that have mutually aligned arrays of openings with each spring contact lodged in a respective pair of aligned openings in each lamination with its expanded midsection press-fit into both lamination openings to secure said laminations together immediately adjacent each other without adhesive, and
   iii) a positioning structure on one side of said substrate for holding an IC chip with the chip's contacts aligned with the contact heads of respective spring contacts on that side of the substrate, said chip positioning structure comprising a frame for said chip, c) means for mounting said test socket on said circuit board with the spring contact heads that are located on the opposite side of the substrate from the chip positioning structure contacting respective board contacts and being depressed by said circuit board contacts inward into said substrate against said spring bias, d) means for releasably clamping an IC chip in said positioning structure so that the chip's contacts bear against respective spring contact heads and depress said contact heads inward into said substrate against said spring bias with said contact springs electrically interconnecting the circuit board contacts with respective chips contacts, said releasable clamping means bearing against the outer surface of said IC chip to urge the chip into its frame and extending up from said circuit board to clamp the chip in its frame on the test socket, and e) an electrical interconnection network on said circuit board for applying test signals to and receiving response signals from said chip.

14. The test structure of claim 13, said releasable clamping means including an air cylinder mounted to said circuit board and a mechanical coupling between said air cylinder and an IC chip held in the test socket frame.

15. A test structure for a multi-contact integrated circuit (IC) chip, comprising:

a) a circuit board having an array of contact arranged in alignment with at least some of the contacts of said IC chip, b) a test socket for said IC chip, comprising:
   i) a substrate,
   ii) an array of double-ended spring contacts positively retained in said substrate, each spring contact having a pair of electrically connected contact heads that are spring biased to extend out from opposite respective sides of the substrate, said substrate comprising a pair of substrate laminations that have mutually aligned arrays of openings, with each spring contact lodged in a respective pair of aligned openings in each lamination with its expanded midsection press-fit into both lamination openings to secure said laminations together immediately adjacent each other without adhesive, and
   iii) a positioning structure on one side of said substrate for holding an IC chip with the chip's contacts aligned with the contact heads of respective spring contacts on that side of the substrate, c) means for mounting said test socket on said circuit board with the spring contact heads that are located on the opposite side of the substrate from the chip positioning structure contacting respective board contacts and being depressed by said circuit board contacts inward into said substrate against said spring bias, said mounting means comprising a plurality of arms extending laterally outward from the test socket substrate, and bolts extending through said arms into corresponding openings in the circuit board, d) means for releasably clamping an IC chip in said positioning structure so that the chip's contacts bear against respective spring contact heads and depress said contact heads inward into said substrate against said spring bias with said contact springs electrically interconnecting the circuit board contacts with respective chips contacts, and e) an electrical interconnection network on said circuit board for applying test signals to and receiving response signals from said chip.

16. A multi-contact electrical interconnection structure for interconnecting a pair of devices that have an array of mutually aligned and opposed electrical contacts, comprising:

first and second substrates having respective arrays of mutually aligned openings extending between opposed major surfaces of the substrates, said substrates positioned adjacent to each other along major surfaces, and an array of double-ended spring contacts retained in said substrate openings, said spring contacts each having a pair of spring biased contact heads that are electrically connected to each other and spring biased to extend out from opposite respective sides of said substrates, and respective hollow bodies from which said contact heads extend, said bodies each having a continuous expanded midsection that is press-fit into a respective pair of aligned openings in said substrates to positively retain the spring contacts in place and secure the substrates together immediately adjacent each other without adhesive, each of said spring contacts including a spring biasing its contact heads to extend out from opposite sides of said substrate, said springs being held in compression between their respective contact heads and electrically connecting said contact heads, with said contact heads normally spring biased to maximum outward positions relative to said substrates and being moveable only inward into said substrates against the force of their respective springs.

* * * * *